United States Patent
Joo et al.

(10) Patent No.: US 8,598,010 B2
(45) Date of Patent: Dec. 3, 2013

(54) METHODS OF FORMING VARIABLE-RESISTANCE MEMORY DEVICES AND DEVICES FORMED THEREBY

(75) Inventors: Heung Jin Joo, Suwon-si (KR); JaeHee Oh, Seongnam-si (KR); Byoungjae Bae, Hwaseong-si (KR); Myung Jin Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 359 days.

(21) Appl. No.: 13/090,553

(22) Filed: Apr. 20, 2011

(65) Prior Publication Data

US 2011/0263093 A1  Oct. 27, 2011

(30) Foreign Application Priority Data

Apr. 23, 2010  (KR) .................. 10-2010-0037911

(51) Int. Cl.
*H01L 21/02* (2006.01)

(52) U.S. Cl.
USPC .......... 438/382; 438/102; 438/104; 438/381; 438/597; 257/E21.004

(58) Field of Classification Search
USPC .................. 438/102; 257/E21.004
See application file for complete search history.

(56) References Cited

U.S. PATENT DOCUMENTS

| 6,586,761 | B2 | 7/2003 | Lowrey | |
|---|---|---|---|---|
| 6,908,812 | B2 | 6/2005 | Lowrey | |
| 2008/0315174 | A1* | 12/2008 | Kang et al. | 257/4 |
| 2010/0181549 | A1* | 7/2010 | Kim et al. | 257/3 |
| 2010/0203672 | A1* | 8/2010 | Eun et al. | 438/102 |
| 2010/0295123 | A1* | 11/2010 | Lung et al. | 257/334 |
| 2011/0057162 | A1* | 3/2011 | Breitwisch et al. | 257/3 |

FOREIGN PATENT DOCUMENTS

| JP | 2005-340554 | 12/2005 |
|---|---|---|
| KR | 1020090020826 A | 2/2009 |

* cited by examiner

*Primary Examiner* — Angel Roman
(74) *Attorney, Agent, or Firm* — Myers Bigel Sibley & Sajovec, P.A.

(57) ABSTRACT

Methods of forming a variable-resistance memory device include patterning an interlayer dielectric layer to define an opening therein that exposes a bottom electrode of a variable-resistance memory cell, on a memory cell region of a substrate (e.g., semiconductor substrate). These methods further include depositing a layer of variable-resistance material (e.g., phase-changeable material) onto the exposed bottom electrode in the opening and onto a first portion of the interlayer dielectric layer extending opposite a peripheral circuit region of the substrate. The layer of variable-resistance material and the first portion of the interlayer dielectric layer are then selectively etched in sequence to define a recess in the interlayer dielectric layer. The layer of variable-resistance material and the interlayer dielectric layer are then planarized to define a variable-resistance pattern within the opening.

17 Claims, 8 Drawing Sheets

METHODS OF FORMING VARIABLE-RESISTANCE MEMORY DEVICES AND DEVICES FORMED THEREBY

REFERENCE TO PRIORITY APPLICATION

This application claims priority to Korean Patent Application No. 10-2010-0037911, filed Apr. 23, 2010, the contents of which are hereby incorporated herein by reference.

FIELD

The present invention relates to semiconductor devices and, more particularly, to resistance variable memory devices and methods for manufacturing the same.

BACKGROUND

Semiconductor devices are classified into memory devices and logic devices. The memory devices store data. In general, semiconductor memory devices may be classified into volatile memory devices and nonvolatile memory devices. The volatile memory devices lose data stored therein upon interruption of power supply and include Dynamic Random Access Memories (DRAMs) and Static Random Access Memories (SRAMs). On the other hand, the nonvolatile memory devices do not lose stored data even when power supply is interrupted. Examples of the nonvolatile memory devices include programmable read-only memories (PROMs), Erasable PROMs (EPROMs), Electrically EPROMs (EEPROMs), and flash memory devices.

Recently, next-generation semiconductor memory devices such as Ferroelectric RAMs (FRAMs), Magnetic RAMs (MRAMs) and Phase-change RAMs (PRAMs) are being developed in line with the tendency to achieve high performance and low power consumption of semiconductor memory devices. Materials constituting such next-generation semiconductor memory devices tend to vary in their resistance values according to current or voltage, and maintain their own resistances even when current or voltage supplies are interrupted.

SUMMARY

Methods of forming variable-resistance memory devices according to embodiments of the invention include patterning an interlayer dielectric layer to define an opening therein that exposes a bottom electrode of a variable-resistance memory cell, on a memory cell region of a substrate (e.g., semiconductor substrate). These methods further include depositing a layer of variable-resistance material (e.g., phase-changeable material) onto the exposed bottom electrode in the opening and onto a first portion of the interlayer dielectric layer extending opposite a peripheral circuit region of the substrate. The layer of variable-resistance material and the first portion of the interlayer dielectric layer are then selectively etched in sequence to define a recess in the interlayer dielectric layer. The layer of variable-resistance material and the interlayer dielectric layer are then planarized to define a variable-resistance pattern within the opening. This planarization step may include planarizing a bottom of the recess in the interlayer dielectric layer.

According to additional embodiments of the invention, the selectively etching is preceded by depositing a top electrode layer directly on the layer of variable-resistance material. In these embodiments, the selectively etching may then include selectively etching the top electrode layer, the layer of variable-resistance material and the interlayer dielectric layer in sequence to define the recess in the interlayer dielectric layer. Moreover, the planarizing may include planarizing the top electrode layer, the layer of variable-resistance material and the interlayer dielectric layer in sequence to define a variable-resistance pattern and an auxiliary top electrode extending within the opening.

Methods of forming a variable-resistance memory device according to additional embodiments of the invention may include forming a first interlayer dielectric layer on a surface of a substrate. This first interlayer dielectric layer has an uneven surface profile, which contains at least a second surface region that is relatively higher than a first surface region when measured relative to the surface of the substrate. The first surface region of the first interlayer dielectric layer is then patterned to define at least a first opening therein, which is subsequently filled with a diode and a bottom electrode of a variable-resistance memory cell. This bottom electrode is electrically coupled to a first terminal of the diode. A second interlayer dielectric layer is deposited on the first and second surface regions of the first interlayer dielectric layer. This second interlayer dielectric layer is patterned to define a second opening therein that exposes the bottom electrode of a variable-resistance memory cell.

A layer of variable-resistance material is deposited onto the exposed bottom electrode in the second opening and onto a raised portion of the second interlayer dielectric layer extending opposite the second surface region of the first interlayer dielectric layer. The layer of variable-resistance material and the raised portion of the second interlayer dielectric layer are sequentially etched in sequence to define a recess in the second interlayer dielectric layer. The layer of variable-resistance material and the second interlayer dielectric layer are then planarized to define a variable-resistance pattern within the opening. This patterning of the first surface region may include patterning the first surface region of the first interlayer dielectric layer to define at least a first opening therein that exposes the surface of the substrate. The planarizing of the layer of variable-resistance material may also include planarizing a bottom of the recess in the interlayer dielectric layer. According to still further embodiments of the invention, the depositing a layer of variable-resistance material may include depositing a layer of phase-changeable material onto the exposed bottom electrode in the second opening and onto the raised portion of the second interlayer dielectric layer. In addition, the selectively etching the layer of variable-resistance material is preceded by depositing a top electrode layer directly on the layer of variable-resistance material.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
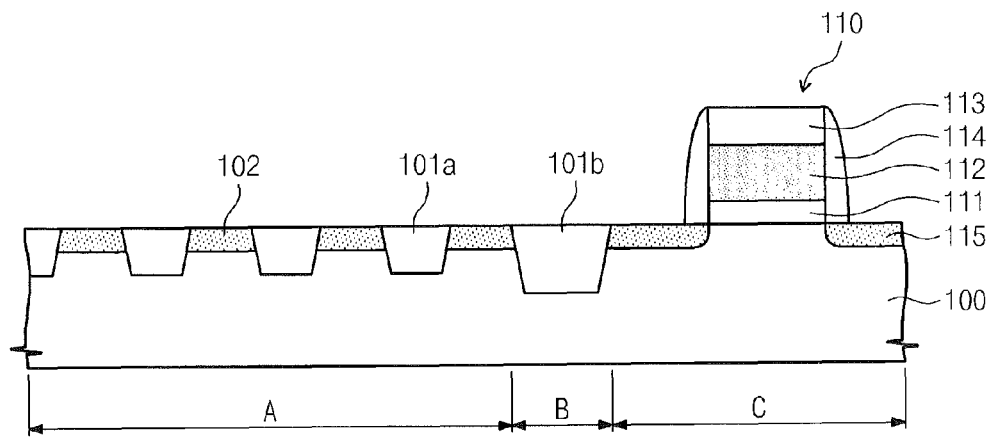
FIGS. 1 through 8 are cross-sectional views illustrating a resistance variable memory device and a method for manufacturing the same according to a first embodiment of the inventive concept.

Objects, features and advantages will be apparent from the following detailed description, given by way of example, in conjunction with the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Also, like reference numerals are used to depict like elements, features and structures throughout the drawings.

It will also be understood that when a layer (or film) such as a conductive layer, a semiconductor layer, and a dielectric layer is referred to as being 'on' another layer or substrate, it can be directly on the other layer or substrate, or intervening layers may also be present. It will be understood that although the terms first, second and third are used herein to describe layers or processes, these elements should not be limited by these terms. These terms are only used to distinguish one layer or process from another one.

In the following description, the technical terms are used only for explaining a specific exemplary embodiment while not limiting the present invention. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

Hereinafter, a semiconductor device and a manufacturing method thereof according to embodiments of the inventive concept will be described in detail with reference to the accompanying drawings. A phase-change memory device will be described as an example in the present embodiments, but embodiments are not limited thereto. For example, embodiments may be applied to all structures in which residues may be generated in a resistance variable memory device such as FRAM or MRAM upon node separation.

FIGS. 1 through 8 are cross-sectional views illustrating a resistance variable memory device and a method for manufacturing the same according to a first embodiment of the inventive concept.

Referring to FIG. 1, a substrate 100 including a cell region A, a peripheral region C, and a boundary region B between the cell region A and the peripheral region C may be provided. In the present disclosure, the cell region A, the peripheral region C, and the boundary region B may represent regions of the substrate 100, or may commonly designate a portion of the substrate 100 and all structures formed over the portion of the substrate 100. For example, the top surface of the cell region A may indicate the top surface of a structure formed in the cell region A. Device isolation patterns 101a and 101b may be formed to define an active region of the substrate. The substrate 100 may include a semiconductor-based structure having a silicon surface. Such a semiconductor-based structure may denote silicon, Silicon-on-Insulator (SOI), and a silicon epitaxial layer supported by a semiconductor structure. The device isolation patterns 101a and 101b may be a trench-type device isolation pattern. For example, the device isolation patterns 101a and 101b may be formed by forming a trench and forming an insulating material filling the trench. The device isolation pattern 101a of the cell region A may be formed thinner than the device isolation pattern 101b of the boundary region B.

A peripheral transistor 110 may be provided in the peripheral region C. The peripheral transistor 110 may include a gate insulation pattern 111, a gate electrode 112, and an upper insulation pattern 113 that are sequentially stacked over the substrate 100. The peripheral transistor 110 may further include a spacer 114 provided on the side wall of the gate insulation pattern 111, the gate electrode 112, and the upper insulation pattern 113. A source/drain region 115 may be formed using the spacer 114 and the upper insulation pattern 113 as an implantation mask. Impurities may be implanted into the active region of the cell region A to form a word line 102.

Figure 2:
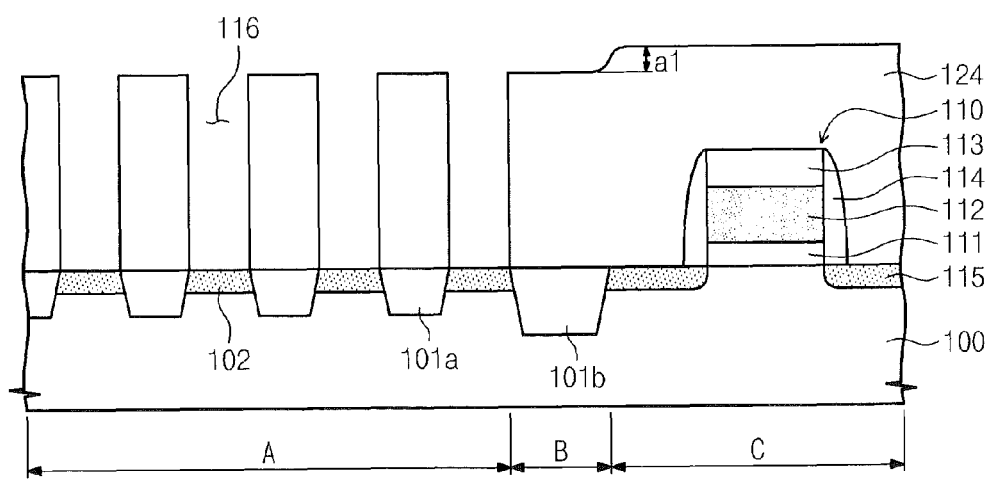

Referring to FIG. 2, a first interlayer dielectric 124 may be formed to cover the peripheral transistor 110 and the substrate 100. The first interlayer dielectric 124 may be an oxide layer. Since the peripheral transistor 110 is formed on the substrate 100, the top surface of the first interlayer dielectric 124 may be higher in the peripheral region C by a1 than in the cell region A. That is, a step height a1 may occur in the boundary region B. The first interlay dielectric 124 of the cell region A may be patterned to form an opening 116. The opening 116 may expose the word line 102.

Figure 3:
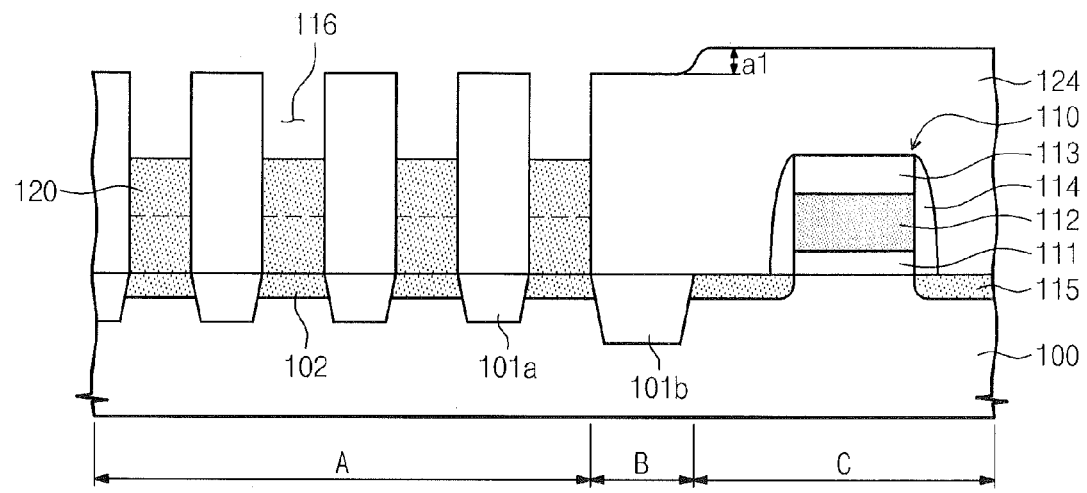

Referring to FIG. 3, a diode 120 may be formed at a lower portion of the opening 116. The diode 120 may be formed by forming an epitaxial layer (not shown) on the exposed substrate 100 through Selective Epitaxial Growth (SEG) and doping the epitaxial layer with impurity elements. The impurity elements may be n-type or p-type impurities. After the epitaxial layer is formed to reach the top surface of the first interlayer dielectric 124, the epitaxial layer may be etched back to form a diode having the same height.

Figure 4:
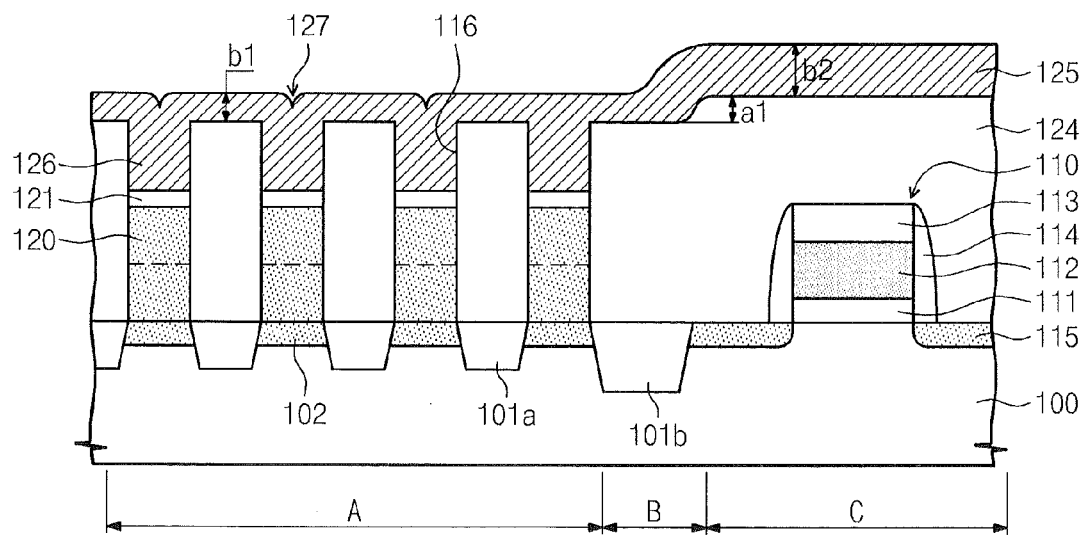

Referring to FIG. 4, a bottom electrode layer 125 may be formed on the diode 120 to fill the opening 116. The bottom electrode layer 125 may be formed of at least one of transition metals, conductive transition metal nitrides, and conductive ternary nitrides. The transition metal may include at least one of titanium (Ti), zirconium (Zr), hafnium (Hf), vanadium (V), niobium (Nb), tantalum (Ta) and tungsten (W). The conductive transition nitride may include at least one of titanium nitride (TiN), hafnium nitride (HfN), vanadium nitride (VN), niobium nitride (NbN), tantalum nitride (TaN), and tungsten nitride (WN). The conductive ternary nitride may include at least one of titanium aluminum nitride (TiAlN), titanium carbonitride (TiCN), tantalum carbonitride (TaCN), titanium silicon nitride (TiSiN), and tantalum silicon nitride (TaSiN).

The bottom electrode layer 125 may have a greater thickness b2 in the peripheral region C than a thickness b1 in the cell region A. This is because the pattern of the cell region A is denser than the pattern of the peripheral region C. A pit 127 may be formed in an upper portion of the bottom electrode layer 125. The pit 127 may be formed at the final stage of the process where the bottom electrode layer 125 is conformally formed in the opening 116. A metal silicide layer 121 may be formed between a bottom electrode 126 and the diode 120. The metal silicide layer 121 may include titanium silicide, cobalt silicide, nickel silicide, or tungsten silicide. The metal silicide layer 121 may provide an ohmic contact between the diode 120 and the bottom electrode 126.

Figure 5:
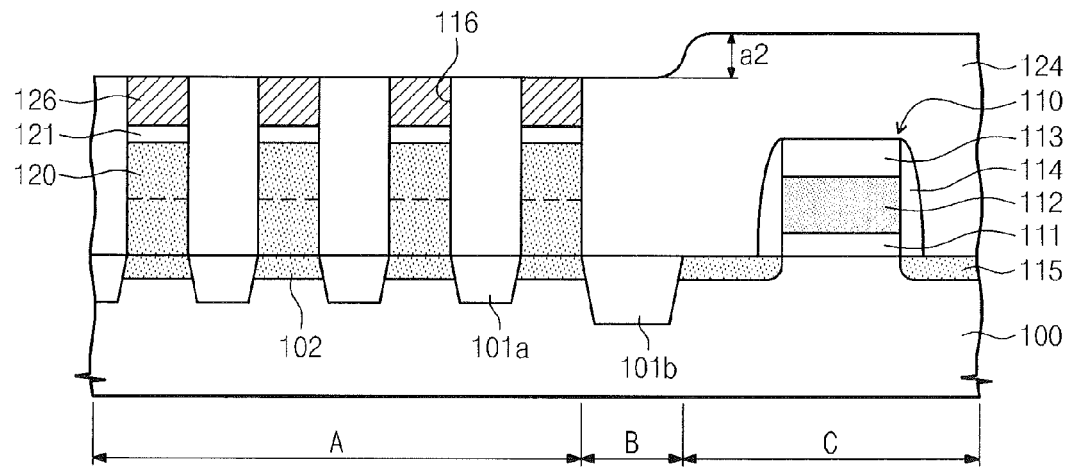

Referring to FIG. 5, the bottom electrode layer 125 may be planarized. The planarization process may include Chemical Mechanical Polishing (CMP). Upon planarization, a planarization rate of the cell region A may be greater than a planarization rate of the peripheral region C. This is because the planarization rate in an area where the pit 127 exists is greater. After the planarization process is completed, the step height a1 may be increased to a step height a2. That is, the step height a2 may be formed between the cell region A and the peripheral region C due to a difference between the thicknesses b1 and b2 and a difference between the planarization rates according to the pit 127. A bottom electrode 126 within the opening 116 may be formed by the planarization process. The bottom electrode 126 may have a cylindrical, U-shaped, linear, or half-ring shaped cross-section.

Figure 6:
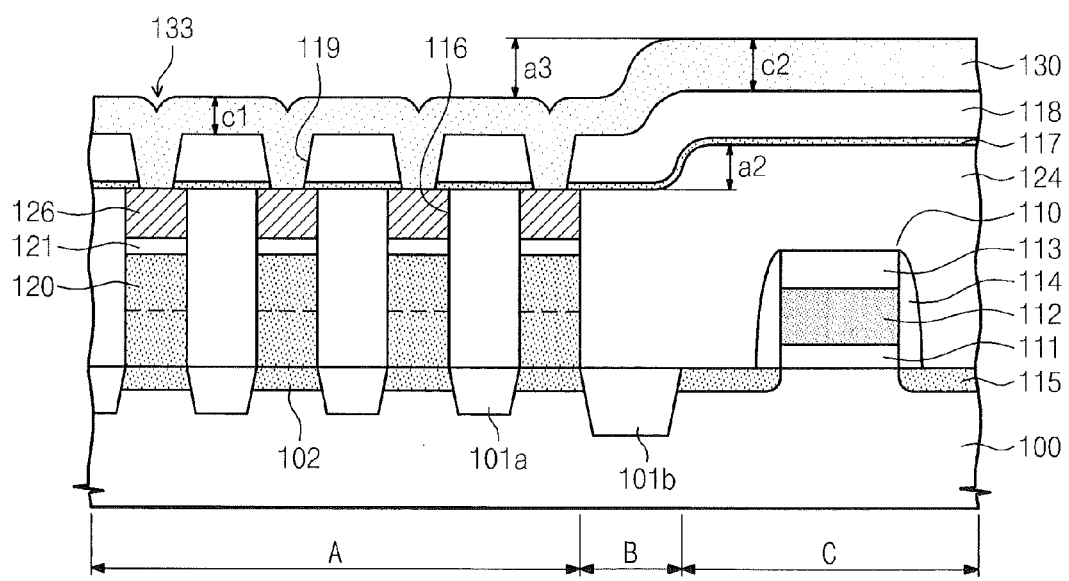

Referring to FIG. 6, a second interlayer dielectric pattern 118 may be provided on the first interlayer dielectric 124. The second interlayer dielectric pattern 118 may be formed by forming a second insulation layer (not shown) on the first interlayer dielectric 124 and then patterning the second insulation layer (not shown) to expose the bottom electrode 126. The second interlayer dielectric pattern 118 may include a recess region 119 exposing the bottom electrode 126. The second interlay insulation pattern 118 may be an oxide layer. An etch stop layer 117 may be provided between the first interlayer insulation layer 124 and the second interlayer dielectric pattern 118. The etch stop layer 117 may prevent over-etching that may be generated when the recess region 119 is formed. The etch stop layer 117 may be a nitride layer or an oxynitride layer. A resistance-variable material layer 130 may be formed to fill the recess region 119 on the second interlayer dielectric pattern 118. The resistance variable material layer 130 may have a greater thickness c2 in the peripheral region C than a thickness c1 in the cell region A. This is because the pattern of the cell region A is denser than the pattern of the peripheral region C. Accordingly, the top surface of the resistance variable material layer 130 of the cell region A and the top surface of the resistance variable material layer 130 of the peripheral region C may have a step height a3 greater than the step height a2. A pit 133 may be formed in an upper portion of the resistance variable material layer 130. The pit 133 may be formed at the final stage of the process where the resistance variable material layer 130 is conformally formed in the recess region 119. In an embodiment, the resistance variable material layer 130 may be a phase-change material layer. The phase-change material layer may include material that is reversibly changeable in its state. The phase-change material layer may be formed using compounds generated by combination of at least one of Te and Se that are chalcogenide-based elements, and at least one of Ge, Sb, Bi, Pb, Sn, Ag, As, S, Si, P, O, and C.

Figure 7:
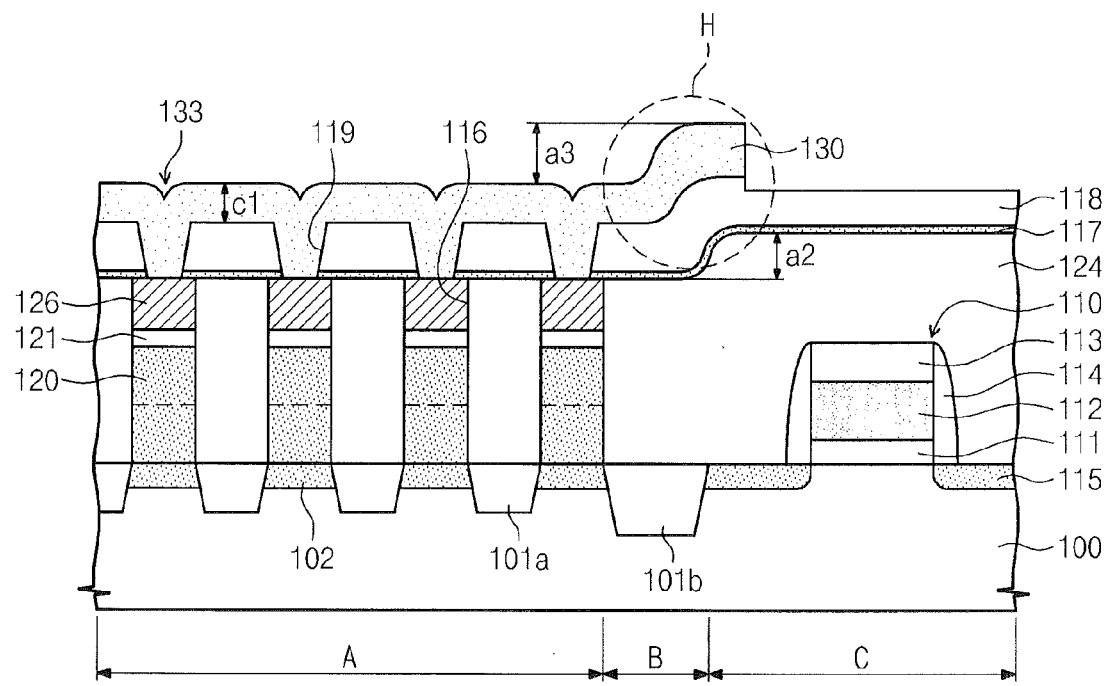

Referring to FIG. 7, the resistance variable material layer 130 of the peripheral region C may be removed. The dotted area H shows that the resistance variable material layer 130 is removed from the peripheral region C. When the resistance variable material layer 130 is removed, a portion of the first interlayer dielectric pattern 118 may be together removed. The removal of the resistance variable material layer 130 of the peripheral region C may also be performed in a portion of the boundary region B. The removal of the resistance variable material layer 130 may be performed by a photolithography process. That is, a dry or wet etching process may be performed in a state where the cell region A is masked. The etching process may be performed until the height of the top surface of the peripheral region C becomes substantially equal to the height of the top surface of the cell region A. For example, after the etching process, a difference between the height of the top surface of the peripheral region C and the height of the top surface of the cell region A may be less than about 150 Å. The above etching process may leave a protruding structure like that in the dotted line H in the boundary region B.

Figure 8:
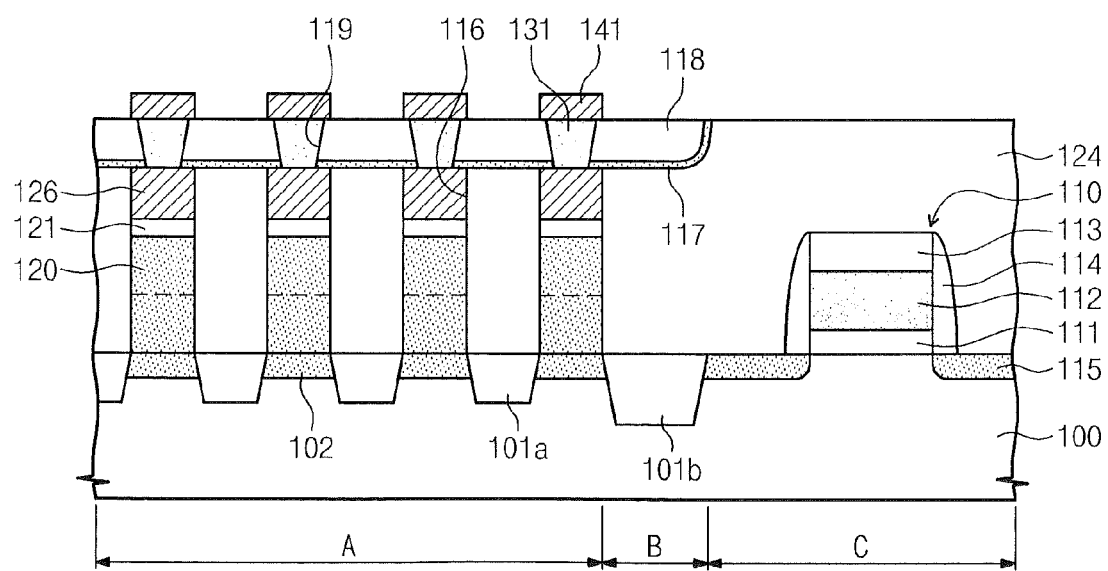

Referring to FIG. 8, the resistance variable material layer 130 may be planarized. The planarization process may be a CMP process. As shown in FIG. 7, since the surface of the peripheral region C has a height similar to the height of the surface of the cell region A, the planarization may be efficiently performed. The protruding structure H in the boundary region B may be easily removed upon planarization. A resistance variable material pattern 131 in the recess region 119 may be formed by the planarization. A top electrode 141 may be formed on the resistance variable material pattern 131. The top electrode 141 may be formed of the same material as the bottom electrode 126.

Figure 9:
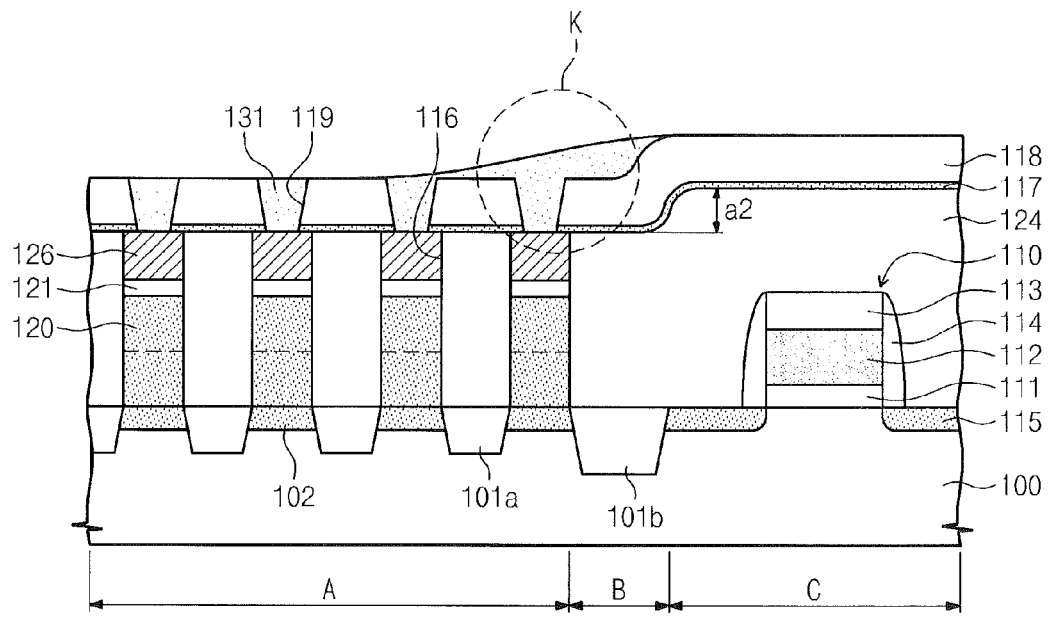
FIG. 9 is a cross-sectional view illustrating a structure of a comparative example regarding the first embodiment of the inventive concept.

FIG. 9 is a cross-sectional view illustrating a structure of a comparative example regarding the first embodiment of the inventive concept. That is, FIG. 9 shows a structure in which the peripheral region C is not etched unlike that in FIG. 7. The resistance variable material layer 130 in the boundary region B and the cell region A adjacent to the boundary region B may not be removed by the step height between the cell region A and the peripheral region C. Accordingly, a bridge like a structure in the dotted line K may be generated between adjacent cells. Also, since the height of the resistance variable material pattern 131 is not uniform, a reset current Ireset may not be uniform. According to the first embodiment of the inventive concept, the resistance variable material layer 130 of the peripheral region C may be removed in advance before the planarization as shown in FIG. 7 to prevent the above phenomenon.

Hereinafter, a resistance variable memory device and a method for manufacturing the same according to a second embodiment of the inventive concept will be described in detail.

Except the pattern of the resistance variable material pattern and the presence or absence of an auxiliary top electrode, the second embodiment is similar to the first embodiment. Accordingly, detailed description of identical technical features will be omitted herein.

FIGS. 10 through 14 are cross-sectional views illustrating a resistance variable memory device and a method for manufacturing the same according to a second embodiment of the inventive concept.

Figure 10:
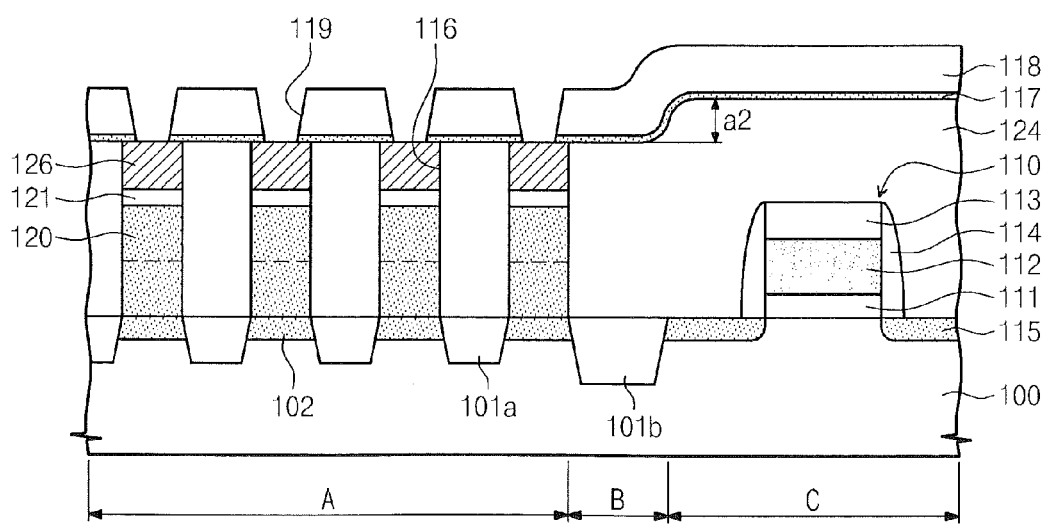
FIGS. 10 through 14 are cross-sectional views illustrating a resistance variable memory device and a method for manufacturing the same according to a second embodiment of the inventive concept.

Referring to FIG. 10, a second interlayer dielectric pattern 118 may be formed on an etch stop layer 117. The second interlayer dielectric pattern 118 may include a recess region 119 exposing a bottom electrode 126. The second interlayer dielectric pattern 118 may be an oxide layer.

Figure 11:
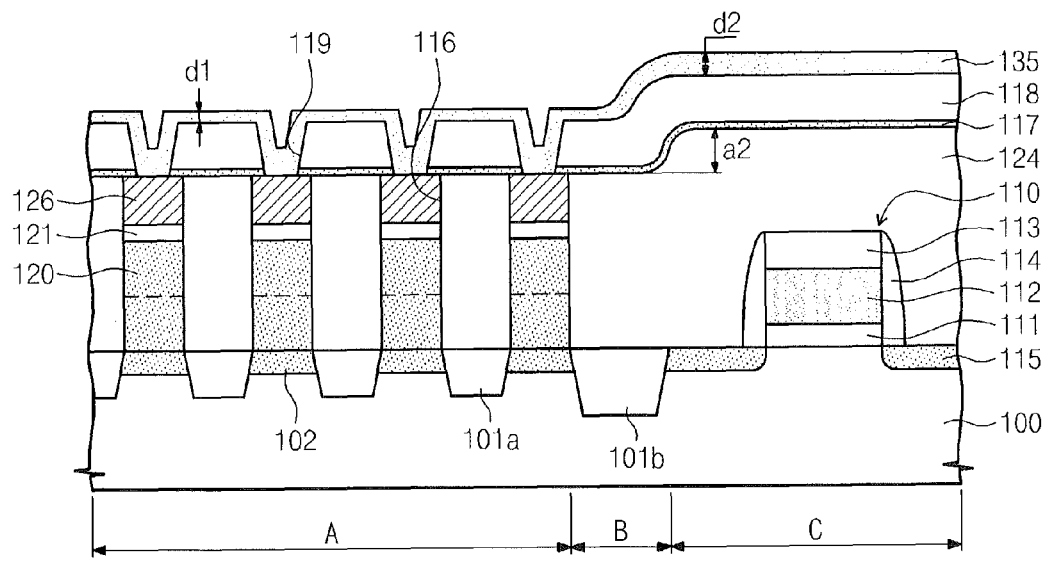

Referring to FIG. 11, a resistance variable material layer 135 may be formed on the recess region 119 and the second interlayer dielectric pattern 118. The resistance variable material layer 135 may be formed to fill a portion of the recess region 119. The resistance variable material layer 135 may have a greater thickness d2 in a peripheral region C than a thickness d1 in a cell region A. This is because the pattern of the cell region A is denser than the pattern of the peripheral region C. For example, the resistance variable material layer 135 may be a phase-change material layer. The phase-change material layer may include material that is reversibly changeable in its state. The phase-change material layer may be formed using compounds generated by combination of at least one of Te and Se that are chalcogenide-based elements, and at least one of Ge, Sb, Bi, Pb, Sn, Ag, As, S, Si, P, O, and C.

Figure 12:
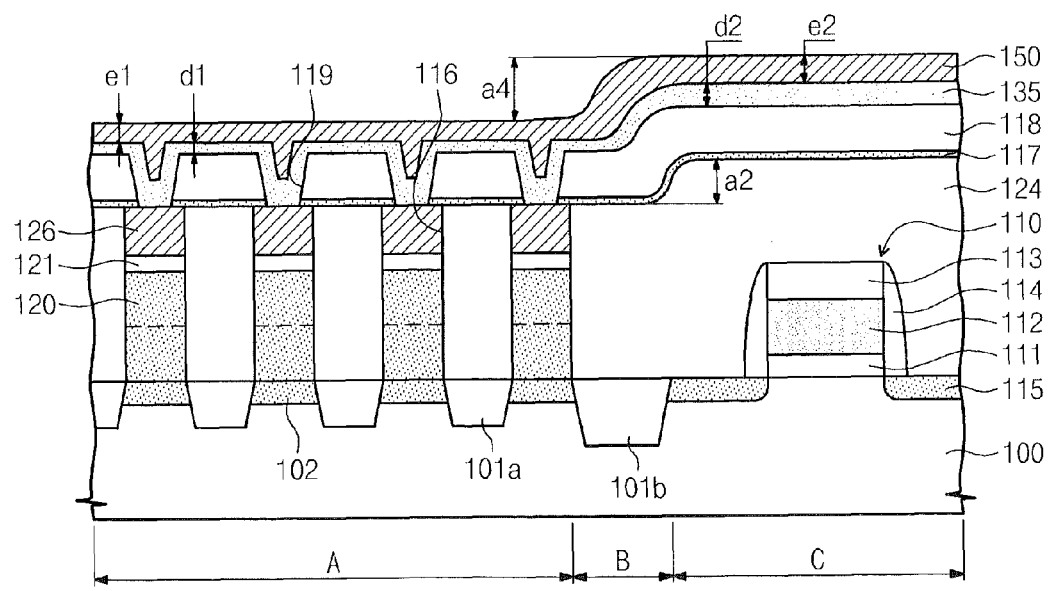

Referring to FIG. 12, an auxiliary top electrode layer 150 may be formed on the resistance variable material layer 135. The auxiliary top electrode layer 150 may fill the recess region 119. The auxiliary top electrode layer 150 may be formed of the same material as a top electrode described below. The auxiliary top electrode layer 150 may have a greater thickness e2 in the cell region A than a thickness e1 in the peripheral region C. This is because the pattern of the cell region A is denser than the pattern of the peripheral region C. Accordingly, the top surface of the auxiliary top electrode layer 150 of the cell region A and the top surface of the auxiliary top electrode layer 150 of the peripheral region C may have a step height a4 than the step height a2.

Figure 13:
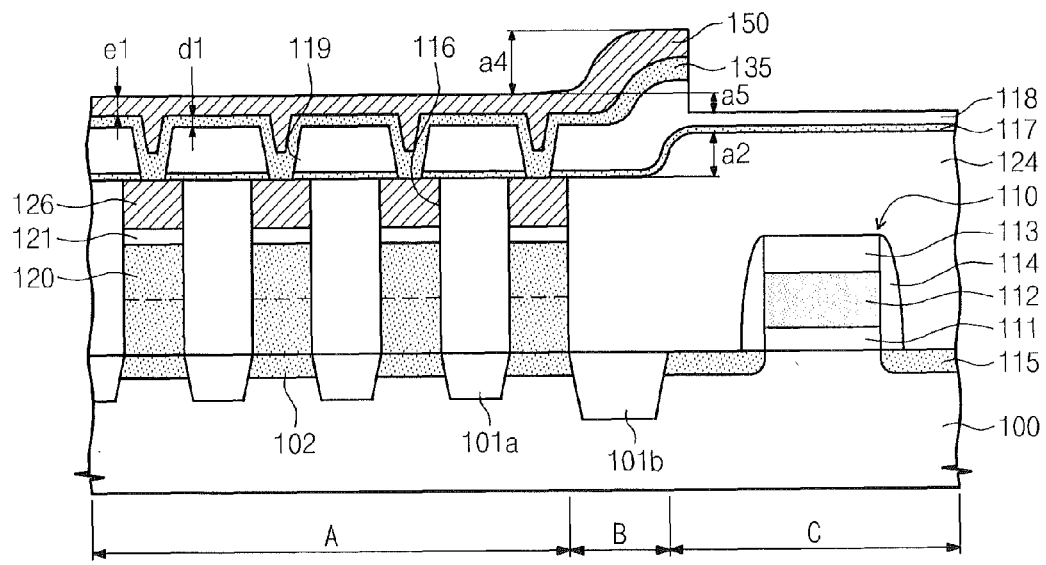

Referring to FIG. 13, the auxiliary top electrode layer 150 and the resistance variable material layer 135 of the peripheral region C may be removed. When the auxiliary top electrode layer 150 and the resistance variable material layer 135 are removed, a portion of the second interlayer dielectric pattern 118 may be together removed. The removal process may also be performed in a portion of the boundary region B. The removal process may be performed by a photolithography process. That is, a dry or wet etching process may be performed in a state where the cell region A is masked. The etching process may be performed until the height of the top surface of the peripheral region C becomes lower by a certain thickness a5 than the height of the top surface of the cell region A. The above etching process may leave a protruding structure in the boundary region B.

Figure 14:
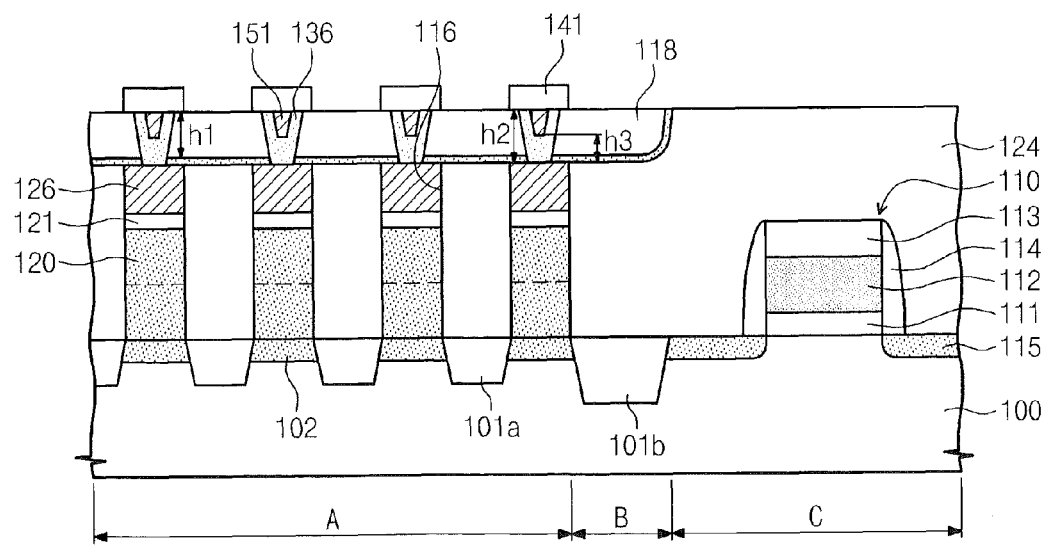

Referring to FIG. 14, a planarization process may be performed. The planarization process may be CMP. As shown in FIG. 13, since the top surface of the peripheral region C is formed lower than the top surface of the cell region A, the protruding structure remaining in the boundary region B may be easily removed. By the planarization, a resistance variable material pattern 136 may be formed in the recess region 119, and an auxiliary top electrode 150 may be formed on the resistance variable material pattern 136 to fill the recess region 119. A top electrode 141 may be formed on the resistance variable material pattern 130. The top electrode 141 may be formed of the same material as the bottom electrode 126. When the auxiliary top electrode 151 is provided, a distance h3 between the bottom surface of the resistance variable material pattern 136 and the bottom surface of the auxiliary top electrode 151 may be uniform in every cell. Accordingly, even when the height h1 of the resistance variable material pattern 136 at a distant location from the boundary region B is greater than the height h2 of the resistance variable material pattern 136 at an adjacent location to the boundary region B due to over-etching, a uniform reset current can be obtained.

Figure 15:
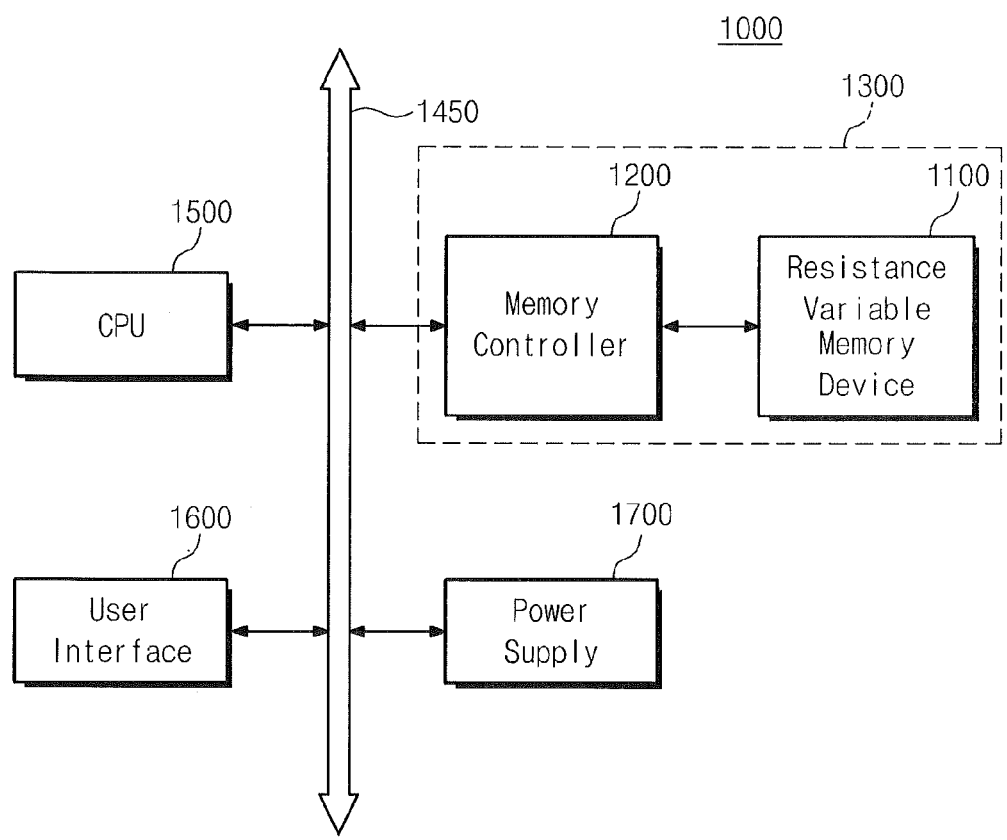
FIG. 15 is a block diagram illustrating an application of a resistance variable memory device to a memory system according to embodiments of the inventive concept.

FIG. 15 is a block diagram illustrating an application of a resistance variable memory device to a memory system according to embodiments of the inventive concept.

Referring to FIG. 15, a memory system 1000 may include a semiconductor memory device 1300 including a resistance variable memory device 1100 and a memory controller 1200, a central processing unit (CPU) 1500 electrically connected to a system bus 1450, a user interface 1600, and a power supply 1700.

The resistance variable memory device 1100 may store data supplied through the user interface 1600 or processed by the CPU 1500, through the memory controller 1200. The resistance variable memory device 1100 may include a Solid State Disk (SSD) and in this case a writing speed of the memory system 1000 will be considerably improved.

Although not shown, it will be understood by those skilled in the art that the memory system 1000 according to the embodiments of the inventive concept may further include an application chipset, a camera image processor (CIS), a mobile dynamic random access memory (DRAM), and so forth.

Also, the memory system 1000 may be applied to a personal digital assistant (PDA), a portable computer, a web tablet, a wireless phone, a mobile phone, a digital music player, a memory card, or any other devices capable of wirelessly receiving and/or transmitting data.

Furthermore, the resistance variable memory device or memory system of the inventive concept may be mounted using various kinds of packages. The various kinds of the packages of the resistance variable memory device or the memory system according to embodiments of the inventive concept may include Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Upon node separation of a resistance variable material layer, a step height between a cell region and a peripheral region can prevent a portion of the resistance variable material layer from remaining in a boundary region. Also, a variation of a reset current due to a height difference of a resistance variable material pattern can be inhibited by providing an auxiliary top electrode.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a variable-resistance memory device, comprising:
    patterning an interlayer dielectric layer to define an opening therein that exposes a bottom electrode of a variable-resistance memory cell, on a memory cell region of a substrate;
    depositing a layer of variable-resistance material onto the exposed bottom electrode in the opening and onto a first portion of the interlayer dielectric layer on a peripheral circuit region of the substrate;

selectively etching the layer of variable-resistance material and the first portion of the interlayer dielectric layer in sequence to define a recess in the interlayer dielectric layer; and planarizing the layer of variable-resistance material and the interlayer dielectric layer to define a variable-resistance pattern within the opening.

2. The method of claim 1, wherein said planarizing comprises planarizing a bottom of the recess in the interlayer dielectric layer.

3. The method of claim 1, wherein said selectively etching is preceded depositing a top electrode layer directly on the layer of variable-resistance material; and wherein said selectively etching comprises selectively etching the top electrode layer, the layer of variable-resistance material and the interlayer dielectric layer in sequence to define the recess in the interlayer dielectric layer.

4. The method of claim 3, wherein said planarizing comprises planarizing the top electrode layer, the layer of variable-resistance material and the interlayer dielectric layer in sequence to define a variable-resistance pattern and an auxiliary top electrode extending within the opening.

5. The method of claim 1, wherein said depositing comprises depositing a layer of phase-changeable material onto the exposed bottom electrode in the opening and onto the first portion of the interlayer dielectric layer.

6. A method for manufacturing a resistance variable memory device, the method comprising:

preparing a substrate having a cell region and a peripheral region;

forming a peripheral transistor in the peripheral region;

forming an interlayer dielectric covering the peripheral transistor and the substrate;

forming a recess region in the cell region by patterning the interlayer dielectric;

forming a resistance variable material layer on the recess region and the interlayer dielectric;

removing the resistance variable material layer of the peripheral region, by removing a portion of the interlayer dielectric of the peripheral region; and forming a resistance variable material pattern by a planarization process.

7. The method of claim 6, wherein the removing of the resistance variable material layer of the peripheral region comprises etching a portion of the interlayer dielectric and the resistance variable material layer of the peripheral region to substantially equalize a height of a top surface of the peripheral region with a height of a top surface of the cell region.

8. A method for manufacturing a resistance variable memory device, the method comprising:

preparing a substrate having a cell region and a peripheral region;

forming a peripheral transistor in the peripheral region;

forming an interlayer dielectric covering the peripheral transistor and the substrate;

forming a recess region in the cell region by patterning the interlayer dielectric;

forming a resistance variable material layer on the recess region and the interlayer dielectric;

removing the resistance variable material layer of the peripheral region; and forming a resistance variable material pattern by a planarization process;

wherein the forming of the interlayer dielectric comprises forming a first interlayer dielectric covering the peripheral transistor and the substrate and a second interlayer dielectric over the first interlayer dielectric; and wherein a top surface of the first interlayer dielectric is higher in the peripheral region than in the cell region.

9. The method of claim 8, further comprising forming an opening exposing the substrate in the first interlayer dielectric of the cell region.

10. The method of claim 9, further comprising:

forming a diode in the opening; and forming a bottom electrode over the diode in the opening.

11. The method of claim 10, wherein the forming of the bottom electrode comprises:

forming a bottom electrode layer filling the opening on the first interlayer dielectric; and forming a planarization process on the bottom electrode layer.

12. The method of claim 10, wherein the forming of the recess region in the cell region by patterning the interlayer dielectric comprises forming a recess region exposing a top surface of the bottom electrode by patterning the second interlayer dielectric.

13. A method for manufacturing a resistance variable memory device, the method comprising:

preparing a substrate having a cell region and a peripheral region;

forming a peripheral transistor in the peripheral region;

forming an interlayer dielectric covering the peripheral transistor and the substrate;

forming a recess region in the cell region by patterning the interlayer dielectric;

forming a resistance variable material layer on the recess region and the interlayer dielectric;

removing the resistance variable material layer of the peripheral region; and forming a resistance variable material pattern by a planarization process;

wherein the resistance variable material layer in the peripheral region has a greater than a thickness of the resistance variable material layer in the cell region.

14. The method of claim 6, wherein the removing of the resistance variable material layer of the peripheral region comprises etching a portion of the interlayer dielectric and the resistance variable material layer of the peripheral region to lower a height of a top surface of the peripheral region compared to a height of a top surface of the cell region.

15. The method of claim 13, wherein the forming of the resistance variable material layer on the recess region and the interlayer dielectric comprises:

forming a resistance variable material layer filling a portion of the recess region; and forming an auxiliary top electrode filling other portions of the recess region on the resistance variable material layer.

16. The method of claim 15, wherein the forming of the auxiliary top electrode comprises:

forming an auxiliary top electrode layer filling the recess region on the resistance variable material layer; and forming an auxiliary top electrode provided in the recess region by performing a planarization process.

17. The method of claim 16, further comprising the forming of the top electrode over the auxiliary top electrode.

* * * * *